(12) United States Patent
Tamura et al.

(10) Patent No.: US 8,049,420 B2
(45) Date of Patent: Nov. 1, 2011

(54) ORGANIC EMITTING DEVICE

(75) Inventors: Shinichiro Tamura, Seongnam-si (KR); Sung-Hun Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 145 days.

(21) Appl. No.: 12/488,454

(22) Filed: Jun. 19, 2009

(65) Prior Publication Data
US 2010/0156279 A1    Jun. 24, 2010

(30) Foreign Application Priority Data
Dec. 19, 2008 (KR) .................. 10-2008-0130536

(51) Int. Cl.
*H01J 1/62* (2006.01)
(52) U.S. Cl. ....................... 313/506; 313/504
(58) Field of Classification Search .............. 313/504, 313/506, 509
See application file for complete search history.

(56) References Cited

U.S. PATENT DOCUMENTS

| | | | |
|---|---|---|---|
| 7,902,738 B2 * | 3/2011 | Yoon et al. | 313/498 |
| 2005/0088085 A1 | 4/2005 | Nishikawa et al. | |
| 2007/0200123 A1 | 8/2007 | Yamamichi et al. | |
| 2008/0278066 A1 * | 11/2008 | Spindler et al. | 313/504 |

FOREIGN PATENT DOCUMENTS

| | | |
|---|---|---|
| JP | 2005-129509 | 5/2005 |
| JP | 2005-197009 | 7/2005 |
| JP | 2006-073641 | 3/2006 |
| JP | 2006-253015 | 9/2006 |
| KR | 2002-0038305 | 5/2002 |
| KR | 2007-0058765 | 6/2007 |
| KR | 2008-0061673 | 7/2008 |
| KR | 2008-0061675 | 7/2008 |
| KR | 2008-0064133 | 7/2008 |

* cited by examiner

*Primary Examiner* — Vip Patel
(74) *Attorney, Agent, or Firm* — Innovation Counsel LLP

(57) ABSTRACT

An organic light emitting device according to an exemplary embodiment of the present invention includes: a substrate including a first region, a second region, and a third region; a thin film structure disposed on the substrate; a first color filter, a second color filter, and a third color filter formed on the thin film structure, and respectively corresponding to the first region, the second region, and the third region; a first light emitting member formed on the first region and the second region; and a second light emitting member disposed on the third region, wherein the first light emitting member has a maximum light emitting value in a wavelength range of about 500 nm to 800 nm, and the second light emitting member has a maximum light emitting value in a wavelength range of about 400 nm to 500 nm.

16 Claims, 16 Drawing Sheets

(a)

(b)

(a)

(b)

(a)

(b)

(a)

(b)

(a)

(b)

ORGANIC EMITTING DEVICE

CROSS-REFERENCE TO RELATED APPLICATION

This application claims priority to and the benefit of Korean Patent Application No. 10-2008-0130536 filed in the Korean Intellectual Property Office on Dec. 19, 2008, the entire contents of which are incorporated herein by reference.

BACKGROUND (a) Technical Field

Embodiments of the present invention generally relate to an organic light emitting device.

(b) Description of the Related Art

An organic light emitting device includes a plurality of pixels, and each pixel includes an organic light emitting element and a plurality of thin film transistors for driving it.

The organic light emitting element includes an anode and a cathode as two electrodes and an organic light emitting member as the emission layer disposed therebetween. The organic light emitting member emits light of three primary colors such as red, green, and blue, or white.

The organic light emitting member is formed through patterning, or by an Inkjet method by separately using a metal mask.

However, as the size of the display device is increased and the resolution is improved, the size of the mask for manufacturing the organic light emitting member is increased, and the size of the pixels is reduced. Accordingly, the metal mask having a large size is bent at some regions during the deposition process, and it is difficult to correctly align the metal mask to correspond to the small pixels. Also, when using the Inkjet printing method, a light emitting member of a solution state must be used, however the light emitting characteristics are decreased compared with the light emitting member used in the deposition method.

The above information disclosed in this Background section is only for enhancement of understanding of the background of the invention and therefore it may contain information that does not form the prior art that is already known in this country to a person of ordinary skill in the art.

SUMMARY

Embodiments of the present invention simply form an organic light emitting member while maintaining high light emitting characteristics and high display characteristics.

An organic light emitting device according to an exemplary embodiment of the present invention includes: a substrate including a first region, a second region, and a third region; a thin film structure disposed on the substrate; a first color filter, a second color filter, and a third color filter formed on the thin film structure, and respectively corresponding to the first region, the second region, and the third region; a first light emitting member formed on the first region and the second region; and a second light emitting member disposed on the third region, wherein the first light emitting member has a maximum light emitting value in a wavelength range of about 500 nm to 800 nm, and the second light emitting member has a maximum light emitting value in a wavelength range of about 400 nm to 500 nm.

The first light emitting member may have a maximum light emitting value in two wavelength ranges of about 500 nm to 550 nm and about 580 nm to 640 nm.

The first light emitting member may include a first sub light emitting member having a maximum light emitting value in a wavelength range of about 500 nm to 550 nm, and a second sub-light-emitting member having a maximum light emitting value in a wavelength range of about 580 nm to 640 nm.

A plane area occupied by the first light emitting member may be almost the same as a plane area occupied by the second light emitting member.

The plane area occupied by the first light emitting member may be different from the plane area occupied by the second light emitting member.

The plane area occupied by the first light emitting member may be about two times the plane area occupied by the second light emitting member.

The second light emitting member may have a maximum light emitting value at a wavelength of about 460 nm.

The organic light emitting device may further include: an insulating layer formed on the first color filter, the second color filter, and the third color filter, and the thin film structure; a first transflective member, a second transflective member, and a third transflective member disposed on the insulating layer, and respectively formed in the first region, the second region, and the third region; an assistance member disposed on the first transflective member; a first pixel electrode, a second pixel electrode, and a third pixel electrode respectively formed on the assistance member, the second transflective member, and the third transflective member; and a common electrode formed on the first organic light emitting member and the second organic light emitting member.

The first organic light emitting member may be thicker than the second organic light emitting member.

The assistance member, and the first pixel electrode, the second pixel electrode, and the third pixel electrode may be formed with the same layer.

An organic light emitting device according to another exemplary embodiment of the present invention includes: a substrate including a first region, a second region, and a third region; a thin film structure disposed on the substrate; a first color filter, a second color filter, and a third color filter formed on the thin film structure, and respectively corresponding to the first region, the second region, and the third region; a first light emitting member formed on the first region and the second region; and a second light emitting member disposed on the first region, the second region, and the third region, wherein the first light emitting member has a maximum light emitting value in a wavelength range of about 500 nm to 800 nm, and the second light emitting member has a maximum light emitting value in a wavelength range of about 400 nm to 500 nm.

The first light emitting member may have a maximum light emitting value in two wavelength ranges of about 500 nm to 550 nm and about 580 nm to 640 nm.

The first light emitting member may include a first sub-light-emitting member having a maximum light emitting value in a wavelength range of about 500 nm to 550 nm, and a second sub-light-emitting member having a maximum light emitting value in a wavelength range of about 580 nm to 640 nm.

The second light emitting member may have a maximum light emitting value at a wavelength of about 460 nm.

The organic light emitting device may further include: an insulating layer formed on the first color filter, the second color filter, and the third color filter, and the thin film structure; a first transflective member, a second transflective member, and a third transflective member disposed on the insulating layer, and respectively formed in the first region, the second region, and the third region; an assistance member disposed on the first transflective member; a first pixel electrode, a second pixel electrode, and a third pixel electrode respectively formed on the assistance member, the second transflective member, and the third transflective member; and a common electrode formed on the first organic light emitting member and the second organic light emitting member.

The first organic light emitting member may be thicker than the second organic light emitting member.

The assistance member, and the first pixel electrode, the second pixel electrode, and the third pixel electrode may be formed with a same layer.

DETAILED DESCRIPTION

Figure 1:
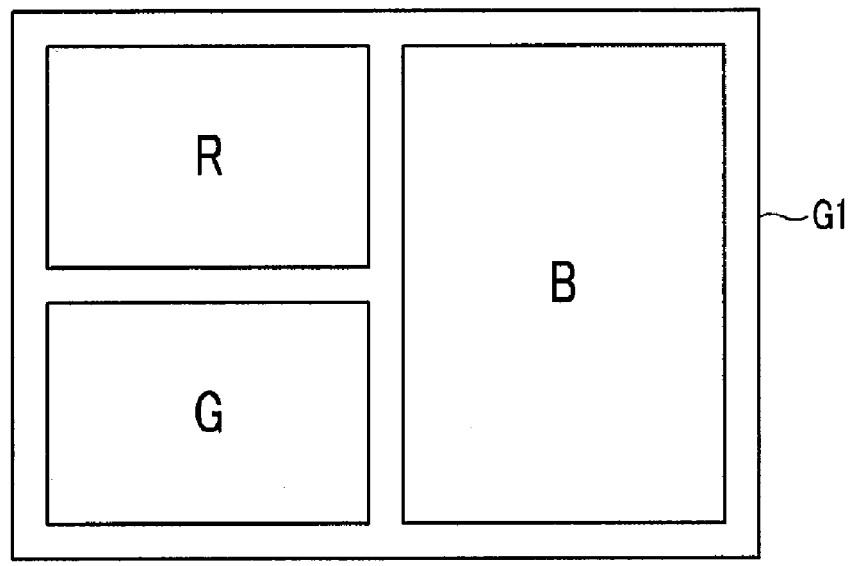
FIG. 1 is a top plan view schematically showing the arrangement of a plurality of pixels in an organic light emitting device according to an exemplary embodiment of the present invention.
Figure 1:
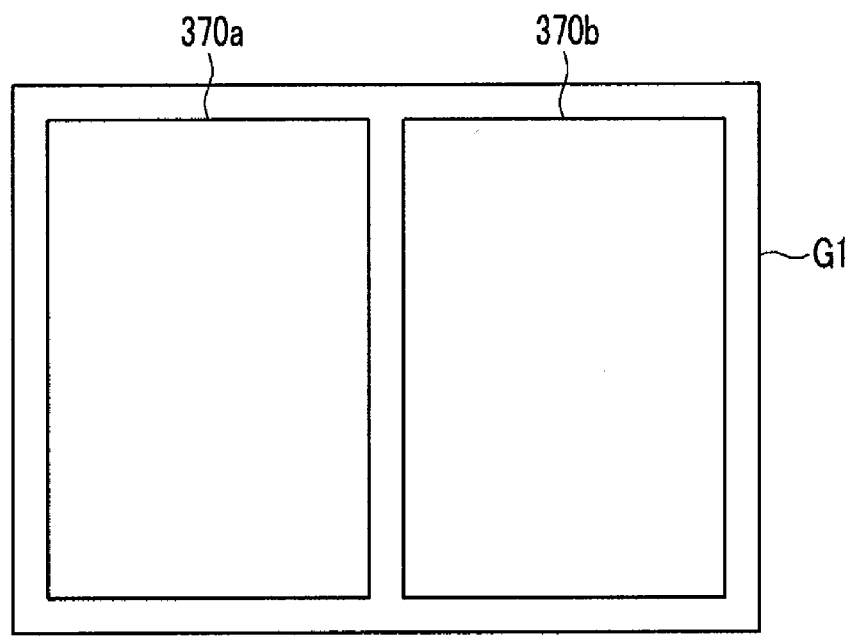

The present disclosure will be described more fully hereinafter with reference to the accompanying drawings, in which exemplary embodiments of the invention are shown. As those skilled in the art would realize, the described embodiments may be modified in various different ways, all without departing from the spirit or scope of the present disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

First, an arrangement of a plurality of pixels in an organic light emitting device according to an exemplary embodiment of the present invention will be described with reference to FIG. 1.

FIG. 1 is a top plan view schematically showing the arrangement of a plurality of pixels in an organic light emitting device according to an exemplary embodiment of the present invention. FIG. 1(a) represents an arrangement of the pixels, and FIG. 1(b) represents a light emitting member arranged in the pixels of FIG. 1(a).

Referring to FIG. 1(a), in the display device according to an exemplary embodiment of the present invention, a red pixel R displaying red, a green pixel G displaying green, and a blue pixel B displaying blue are disposed while forming one group G1. This pixel group G1 may be repeated according to the row and/or column, and the sequence of the red pixel R, the green pixel G, and the blue pixel B of each group G1 may be changed. As shown in FIG. 1(a), the red pixel R and the green pixel G disposed in the pixel group G1 according to the present exemplary embodiment have almost the same area, and the area of the region occupied by the blue pixel B may be larger than the area of the regions occupied by the red pixel R and the green pixel G, and may be twice the size of each.

Referring to FIG. 1(b), in the display device according to an exemplary embodiment of the present invention, the first light emitting member 370a is formed in the red pixel R and the green pixel G, and the second light emitting member 370b is formed in the blue pixel B. The area of the region occupied by the first light emitting member 370a may be the same as the area of the region occupied by the second light emitting member 370b. The first light emitting member 370a and the second light emitting member 370b may be organic light emitting members.

The maximum value among the light emitting wavelength of the first light emitting member 370a may be in a wavelength range of about 500 nm to 800 nm, and the maximum light emitting value of the first light emitting member 370a may have two wavelength ranges of about 500 nm to 550 nm and about 580 nm to 640 nm. The maximum value among the light emitting wavelength of the second light emitting member 370b may be in a wavelength range of about 400 nm to 500 nm, and may be about 460 nm.

The first light emitting member 370a may emit the first color, for example an orange color, and the second light emitting member 370b may emit the second color, for example a blue color. The first light emitting member 370a has a layered structure of a first sub-light emitting member having a maximum light emitting wavelength value of about 500 nm to 550 nm thereby emitting green, and a second sub-light emitting member having a maximum light emitting wavelength value of about 580 nm to 640 nm thereby emitting red. Also, the first light emitting member 370a may be made of a single layer, and the single layer may include a white light emitting member and pigments emitting the orange color. The pigments emitting the orange color may be a mixture of the red pigments and the green pigments.

Figure 2:
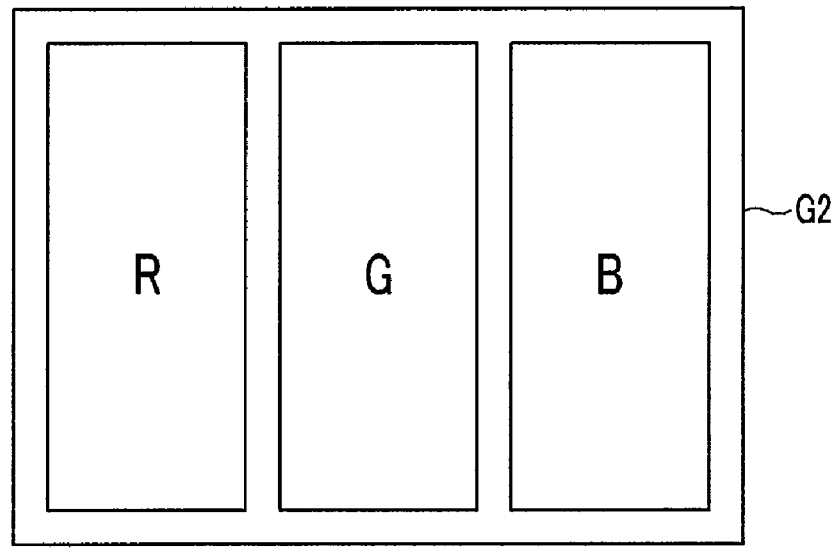
FIG. 2 is a top plan view schematically showing the arrangement of a plurality of pixels in an organic light emitting device according to another exemplary embodiment of the present invention.
Figure 2:
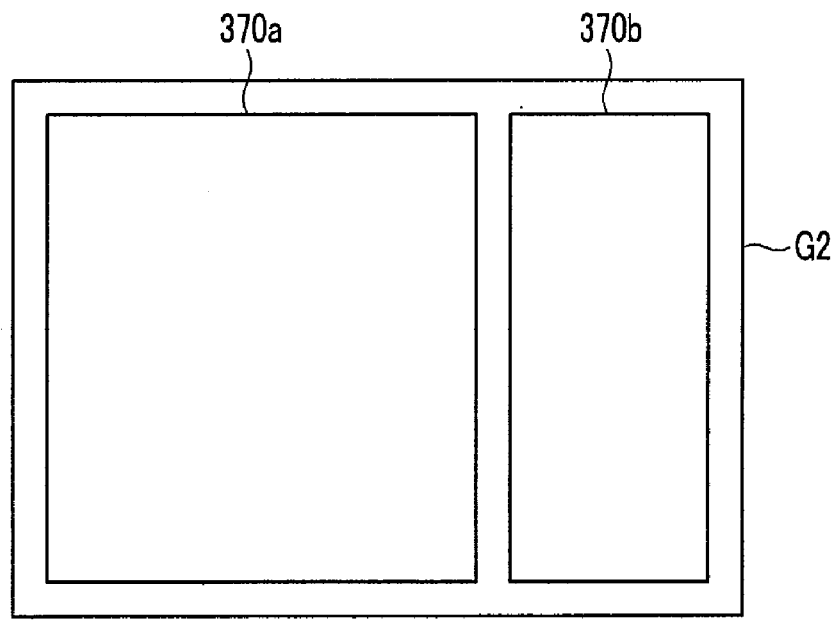

Next, an arrangement of a plurality of pixels in an organic light emitting device according to another exemplary embodiment of the present invention will be described with reference to FIG. 2. FIG. 2 is a top plan view schematically showing the arrangement of a plurality of pixels in another organic light emitting device according to an exemplary embodiment of the present invention, wherein FIG. 2(a) represents an arrangement of the pixels and FIG. 2(b) represents a light emitting member arranged in the pixels of FIG. 2(a).

Referring to FIG. 2(a), in the display device according to an exemplary embodiment of the present invention, a red pixel R displaying red, a green pixel G displaying green, and a blue pixel B displaying blue are disposed while forming one group G2. This pixel group G2 may be repeated according to the row and/or column, and the sequence of the red pixel R, the green pixel G, and the blue pixel B of each group G2 may be changed. As shown in FIG. 2(a), the area of the region occupied by the red pixel R, the green pixel G, and the blue pixel B may be almost the same.

Referring to FIG. 2(b), in the display device according to an exemplary embodiment of the present invention, the first light emitting member 370a is formed in the red pixel R and the green pixel G, and the second light emitting member 370b is formed in the blue pixel B. The plane area of the region occupied by the first light emitting member 370a may be larger than the area of the region occupied by the second light emitting member 370b, and may be, for example, twice the size.

Similar to the exemplary embodiment of FIG. 1, the maximum value among the light emitting wavelength of the first light emitting member 370a may be in a wavelength range of about 500 nm to 800 nm, and the maximum light emitting value of the first light emitting member 370a may have two wavelength ranges of about 500 nm to 550 nm and about 580 nm to 640 nm. The maximum value among the light emitting wavelength of the second light emitting member 370b may be in a wavelength range of about 400 nm to 500 nm, and may be about 460 nm. The first light emitting member 370a has a layered structure of the first sub-light emitting member having a maximum light emitting wavelength value of about 500 nm to 550 nm, and the second sub-light emitting member having a maximum light emitting wavelength value of about 580 nm to 640 nm.

The first light emitting member 370a may emit the first color, for example an orange color, and the second light emitting member 370b may emit the second color, for an example the blue color.

Next, an organic light emitting device according to an exemplary embodiment of the present invention will be described with reference to FIG. 3.

Figure 3:
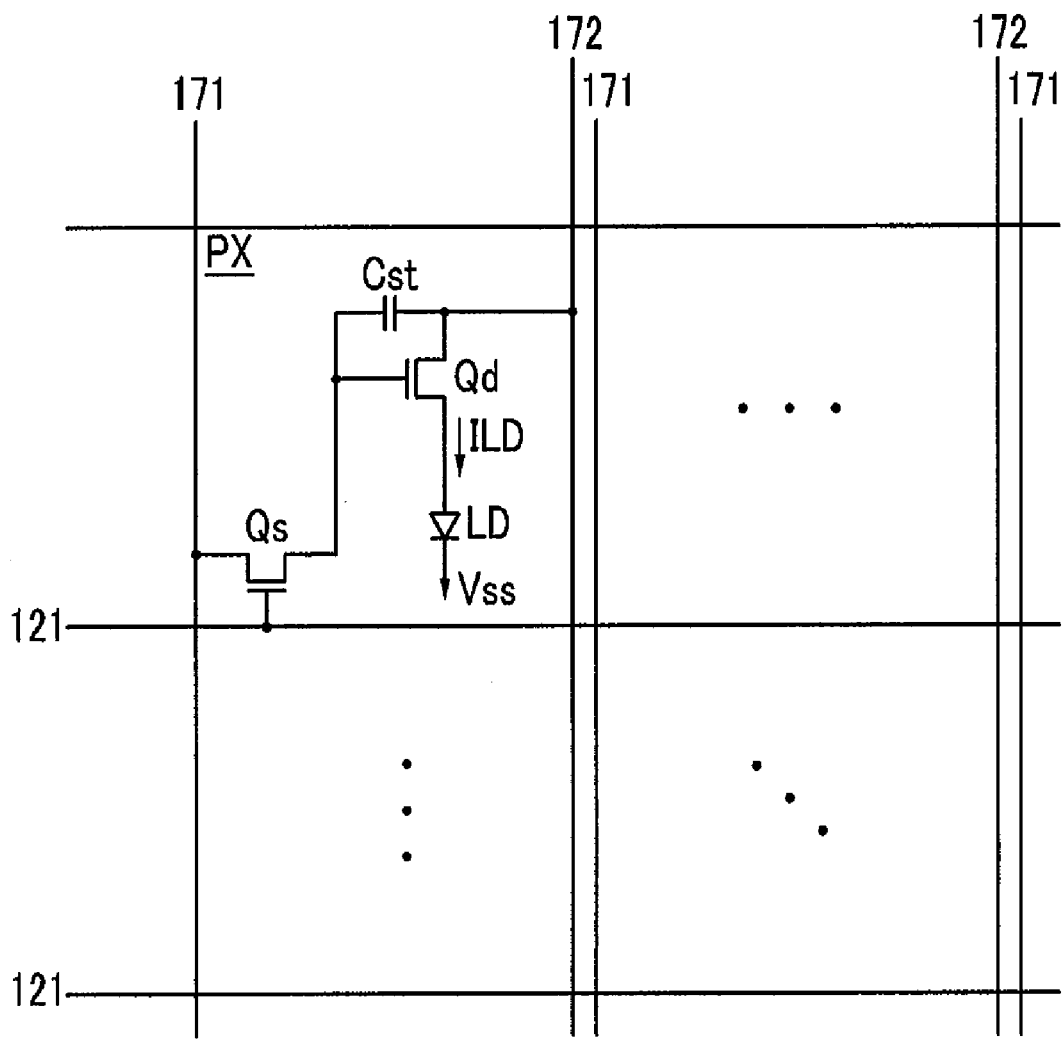
FIG. 3 is an equivalent circuit diagram of one pixel in an organic light emitting device according to an exemplary embodiment of the present invention.

FIG. 3 is an equivalent circuit diagram of one pixel in an organic light emitting device according to an exemplary embodiment of the present invention.

Referring to FIG. 3, an organic light emitting device according to the present exemplary embodiment includes a plurality of signal lines 121, 171, and 172, and a pixel PX connected thereto and arranged substantially in a matrix.

The signal lines include a plurality of gate lines 121 for transmitting gate signals (or scanning signals), a plurality of data lines 171 for transmitting data signals, and a plurality of driving voltage lines 172 for transmitting a driving voltage. The gate lines 121 extend substantially in a row direction and are substantially parallel to each other, and the data lines 171 extend substantially in a column direction and are substantially parallel to each other. Although the driving voltage lines 172 are shown as extending substantially in a column direction, the driving voltage lines 172 may extend in a row direction or in a column direction, or may be formed in a matrix.

Each pixel PX includes a switching transistor Qs, a driving transistor Qd, a storage capacitor Cst, and an organic light emitting element LD.

The switching transistor Qs includes a control terminal, an input terminal, and an output terminal, in which the control terminal is connected to the scanning signal line 121, the input terminal is connected to the data line 171, and the output terminal is connected to the driving transistor Qd. The switching transistor Qs transmits a data signal received from the data line 171 to the driving transistor Qd in response to the scanning signal received from the gate line 121.

The driving transistor Qd also includes a control terminal, an input terminal, and an output terminal, in which the control terminal is connected to the switching transistor Qs, the input terminal is connected to the driving voltage line 172, and the output terminal is connected to the organic light emitting element LD. The driving transistor Qd flows an output current ILD of which the magnitude varies according to the voltage applied between the control terminal and the output terminal.

The capacitor Cst is connected between the control terminal and the input terminal of the driving transistor Qd. The capacitor Cst stores the data signal applied to the control terminal of the driving transistor Qd and maintains the stored data signal even after the switching transistor Qs is turned off.

The organic light emitting element LD is an organic light emitting diode (OLED), for example having an anode connected to the output terminal of the driving transistor Qd and a cathode connected to a common voltage Vss. The organic light emitting element LD emits light of which the intensity is varied according to the output current ILD of the driving transistor Qd, thereby displaying images.

The switching transistor Qs and the driving transistor Qd are n-channel field effect transistors (FET), however at least one of the switching transistor Qs and the driving transistor Qd may be a p-channel FET. Moreover, the connection relationship among the transistors Qs and Qd, the storage capacitor Cst, and the organic light emitting element LD may be changed.

If necessary, there may be other transistors for compensating the threshold voltage of the organic light emitting element LD and the driving transistor Qd as well as the switching transistor Qs and the driving transistor Qd.

Next, a detailed structure of one pixel group of an organic light emitting device according to an exemplary embodiment of the present invention will be described with reference to FIG. 4.

Figure 4:
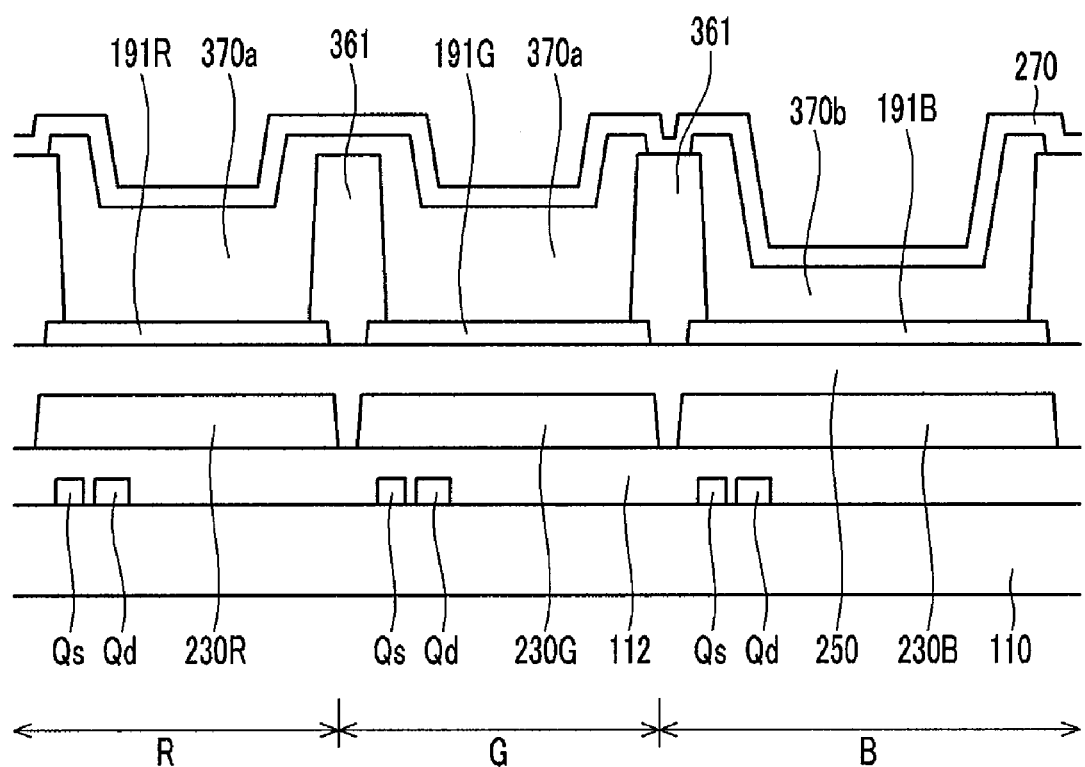
FIG. 4 is a cross-sectional view of an organic light emitting device according to an exemplary embodiment of the present invention.

FIG. 4 is a cross-sectional view of an organic light emitting device according to an exemplary embodiment of the present invention.

The organic light emitting device according to the present exemplary embodiment includes a red pixel R, a green pixel G, and a blue pixel B. Three primary color pixels of colors other than the three primary colors of red, green, and blue may be included.

In the drawings, R, G, and B are added to the reference numerals related to the red pixel R, the green pixel G, and the blue pixel B, respectively.

A plurality of driving transistors Qd and a plurality of switching transistors Qs are formed on an insulation substrate 110 that may be made of transparent glass or plastic. Moreover, a thin film structure 112 is formed on the substrate 110. In the thin film structures 112, an insulating layer for covering the driving transistors Qd and the switching transistors Q may be provided, and another thin film structure may be formed below the driving transistors Qd and the switching transistors Q.

A red color filter 230R, a green color filter 230G, and a blue color filter 230B are formed on the thin film structure 112, and an overcoat 250 is formed on the color filters 230R, 230G, and 230B and the thin film structure 112. The overcoat 250 may be made of an organic material and may have a flat surface. The overcoat 250 has a plurality of through holes (not shown) disposed on the driving transistors Qd.

A plurality of pixel electrodes 191R, 191G, and 191B are formed on the overcoat 250. The pixel electrodes 191R, 191G, and 191B may be made of a transparent conductor such as ITO, IZO, or ZnO. The pixel electrodes 191R, 191G, and 191B are electrically connected to the driving transistor Qd through contact holes (not shown) formed in the overcoat 250, and function as the anode. Each of the pixel electrodes 191R, 191G, and 191B may have the same thickness in the red pixel R, the blue pixel B, and the green pixel G.

A plurality of insulating members 361 to define each pixel are formed on the pixel electrodes 191R, 191G, and 191B, and the first organic light emitting member 370a and the second organic light emitting member 370b are formed on the insulating members 361 and the pixel electrodes 191R, 191G, and 191B. The first organic light emitting member 370a is disposed in the red pixel R and the green pixel G, and the second light emitting member 370b is disposed in the blue pixel B. The second light emitting member 370b may be thinner than the first light emitting member 370a.

The maximum value among the light emitting wavelength of the first light emitting member 370a may be in a wavelength range of about 500 nm to 800 nm, and the maximum light emitting value of the first light emitting member 370a may have two wavelength ranges of about 500 nm to 550 nm and about 580 nm to 640 nm. The maximum value among the light emitting wavelength of the second light emitting member 370b may be in a wavelength range of about 400 nm to 500 nm, and may be about 460 nm.

The first light emitting member 370a may emit the first color, for example an orange color, and the second light emitting member 370b may emit the second color, for example the blue color. The first light emitting member 370a has a layered structure of the first sub-light emitting member having a maximum light emitting wavelength value of about 500 nm to 550 nm thereby emitting green, and the second sub-light emitting member having a maximum light emitting wavelength value of about 580 nm to 640 nm thereby emitting red. Also, the first light emitting member 370a may be made of a single layer, and the single layer may include a white light emitting member and pigments emitting the orange color. The pigments emitting the orange color may be a mixture of the red pigments and the green pigments.

The plane area of the region occupied by the first light emitting member 370a may be equal to or larger than the plane area of the region occupied by the second light emitting member 370b, and when the area of the first organic light emitting member 370a is larger, the area of the first light emitting member 370a may be about two times the area of the second light emitting member 370b.

The first organic light emitting member 370a and the second organic light emitting member 370b may have an organic emission layer emitting light and an auxiliary layer for improving the light emitting efficiency of the organic emission layer. The auxiliary layer may be formed in common in the red pixel R, the green pixel G, and the blue pixel B, and may be deposited on substantially the whole surface of the display device.

The auxiliary layer may include at least one selected from an electron transport layer (not shown), a hole transport layer (not shown), an electron injection layer (not shown), and a hole injection layer (not shown).

A common electrode 270 is formed on the organic light emitting members 370a and 370b. The common electrode 270 may be made of a reflective metal such as Ca, Ba, Mg, Al, and Ag, and may function as the cathode. The common electrode 270 may be formed on substantially the whole surface of the substrate, and may be formed as a pair along with the respective pixel electrodes 191R, 191G, and 191B functioning as the anode, thereby flowing the current to the organic emission layers 370a and 370b.

The organic light emitting device according to the present exemplary embodiment displays images by emitting light downward of the substrate 110.

However, the organic light emitting device according to the present exemplary embodiment includes the pixel electrodes 191R, 191G, and 191B made of the reflective metal and the common electrode 270 made of the transparent conductor such that it may display images by emitting upward of the substrate 110.

Figure 5:
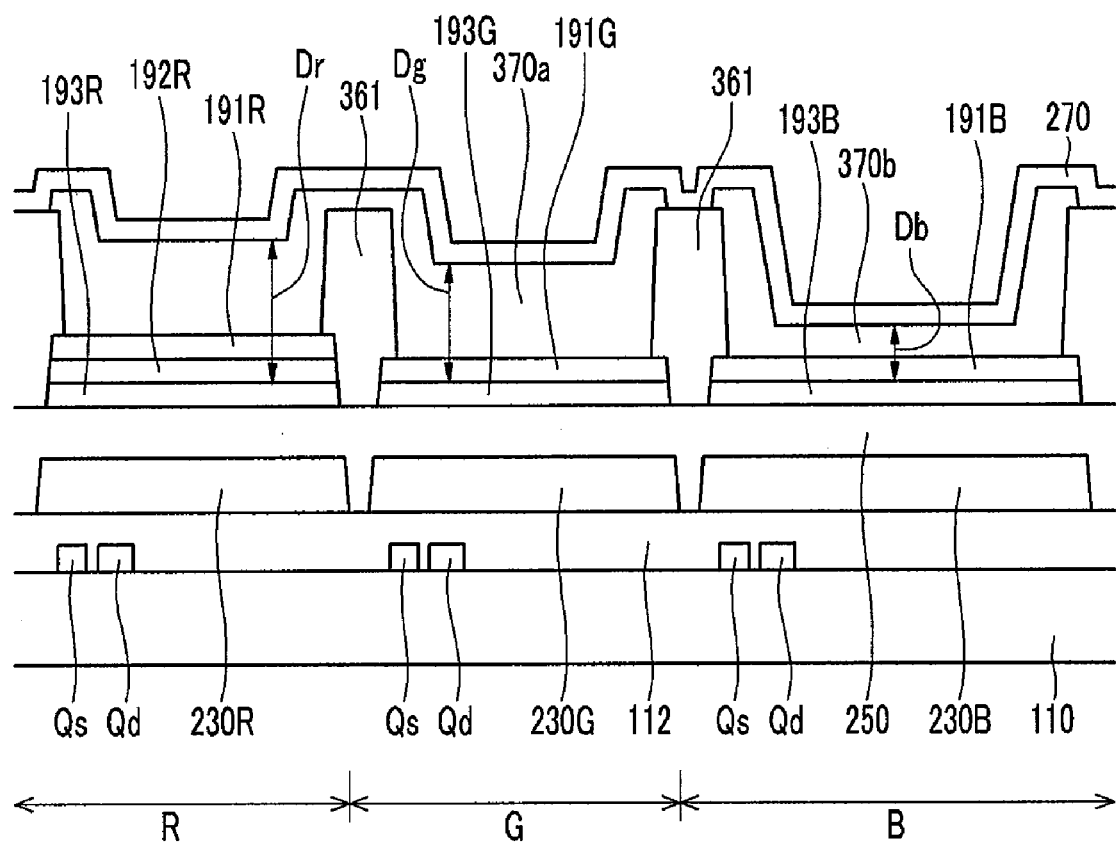
FIG. 5 is a cross-sectional view of an organic light emitting device according to another exemplary embodiment of the present invention.

Next, an organic light emitting device according to another exemplary embodiment of the present invention will be described with reference to FIG. 5. FIG. 5 is a cross-sectional view of an organic light emitting device according to an exemplary embodiment of the present invention.

As shown in FIG. 5, the layered structure of the organic light emitting device according to the present exemplary embodiment is similar to the organic light emitting device shown in FIG. 4.

A thin film structure 112 including a plurality of driving transistors Qd and a plurality of switching transistors Qs is formed on an insulation substrate 110, a red color filter 230R, a green color filter 230G, and a blue color filter 230B are formed on the thin film structure 112, and an overcoat 250 including a plurality of through holes (not shown) disposed on the driving transistor Qd is formed on the color filters 230R, 230G, and 230B and the thin film structure 112.

However, differently from the organic light emitting device of the embodiment of FIG. 4, transflective members 193R, 193G, and 193B are formed on the overcoat 250. The transflective members 193R, 193G, and 193B form a microcavity along with a common electrode 270 that will be described and explained later.

The transflective members 193R, 193G, and 193B may be made of a metal having high reflectance such as silver (Ag), magnesium (Mg), and aluminum (Al), and the thickness thereof may be in a range of about 100 Å-200 Å. If the thickness is small, the metal has a transflective characteristic in which incident light is both reflected and transmitted.

Although not shown, an insulating layer (not shown) to prevent oxidation of the transflective members 193R, 193G, and 193B may be formed on the transflective members 193R, 193G, and 193B and the overcoat 250.

Also, an assistance member 192R may be formed on the transflective member 193R of the red pixel R.

A plurality of pixel electrodes 191R, 191G, and 191B are formed on the assistance member 192R of the red pixel R, and on the transflective members 193G and 193B of the green pixel G and the blue pixel B. The pixel electrodes 191R, 191G, and 191B are electrically connected to the driving transistor Qd through contact holes (not shown), and may function as the anode. The pixel electrodes 191R, 191G, and 191B may have the same thickness in the red pixel R, the blue pixel B, and the green pixel G.

The assistance member 192R of the red pixel R may be made of the same layer as the pixel electrodes 191R, 191G, and 191B, or may be a transparent insulating layer made of a material such as silicon nitride (SiNx). When the assistance member 192R of the red pixel R is made of the same layer as the pixel electrodes 191R, 191G, and 191B, the assistance member 192R may be simultaneously formed by using one photomask when forming the pixel electrodes 191R, 191G, and 191B.

A plurality of insulating members 361 to define each pixel are formed on the pixel electrodes 191R, 191G, and 191B, and the first organic light emitting member 370a and the second organic light emitting member 370b are formed on the insulating member 361 and the pixel electrodes 191R, 191G, and 191B. The first organic light emitting member 370a is disposed in the red pixel R and the green pixel G, and the second light emitting member 370b is disposed in the blue pixel B. The second light emitting member 370b may be thinner than the first light emitting member 370a.

The maximum value among the light emitting wavelength of the first light emitting member 370a may be in a wavelength range of about 500 nm to 800 nm, and the maximum light emitting value of the first light emitting member 370a may have two wavelength ranges of about 500 nm to 550 nm and about 580 nm to 640 nm. The maximum value among the light emitting wavelength of the second light emitting member 370b may be in a wavelength range of about 400 nm to 500 nm, and may be about 460 nm.

The first light emitting member 370a may emit the first color, for example, an orange color and the second light emitting member 370b may emit the second color, for example the blue color. The first light emitting member 370a has the layered structure of the first sub-light emitting member having a maximum light emitting wavelength value of about 500 nm to 550 nm thereby emitting green, and the second sub-light emitting member having a maximum light emitting wavelength value of about 580 nm to 640 nm thereby emitting red. Also, the first light emitting member 370a may be made of a single layer, and the single layer may include a white light emitting member and pigments emitting the orange color. The pigments emitting the orange color may be a mixture of the red pigments and the green pigments.

The plane area of the region occupied by the first light emitting member 370a may be equal to or larger than the plane area of the region occupied by the second light emitting member 370b, and when the area of the first organic light emitting member 370a is larger, the area of the first light emitting member 370a may be about two times the area of the second light emitting member 370b.

The first organic light emitting member 370a and the second organic light emitting member 370b may have an organic emission layer emitting light and an auxiliary layer for improving the light emitting efficiency of the organic emission layer. A common electrode 270 is formed on the organic light emitting members 370a and 370b. The common electrode 270 may be made of a reflective metal such as Ca, Ba, Mg, Al, and Ag, and may function as the cathode. The common electrode 270 may be formed on substantially the whole surface of the substrate, and may be formed as a pair along with the respective pixel electrodes 191R, 191G, and 191B functioning as the anode, thereby flowing the current to the organic emission layers 370a and 370b.

The organic light emitting device according to the present exemplary embodiment displays images by emitting light downward of the substrate 110. The light emitted from the organic emission layer of the organic light emitting member 370 toward the substrate 110 passes through the pixel electrodes 191R, 191G, and 191B and the assistance member 192R, and arrives at the transflective members 193R, 193G, and 193B. The transflective members 193R, 193G, and 193B reflect the incident light toward the common electrode 270, and the common electrode 270 again reflects the light toward the transflective members 193R, 193G, and 193B. Accordingly, the light reciprocating between the transflective members 193R, 193G, and 193B and the common electrode 270 is subjected to an optical process such as interference, and passes through the transflective members 193R, 193G, and 193B and color filters 230R, 230G, and 230B to the outside if an appropriate condition is satisfied.

In a microcavity structure, light is repeatedly reflected between a reflective layer and a translucent layer that are separated by a predetermined distance (an optical length) such that light of a specific wavelength is constructive. Here, the common electrode 270 functions as the reflective layer, and the translucent members 193R, 193G, and 193B function as the transflective layer. By the microcavity structure, light near a wavelength corresponding to the resonance wavelength of the microcavity among the light emitted from the organic emission layer is enhanced through the transflective members 193R, 193G, and 193B, while light of different wavelengths is suppressed. In the microcavity structure, the wavelength range of the enhanced light may be determined according to the path of the light.

Here, according to an exemplary embodiment of the present invention, the path of the light is changed according to the thickness of the thin films between the transflective members 193R, 193G, and 193B, and the common electrode 270, and the optical length Dr of the red pixel R is longest, the optical length Db of the blue pixel B is shortest, and the optical length Dg of the green pixel G is shorter than the optical length Dr of the red pixel R and is longer than the optical length Db of the blue pixel B.

According to an exemplary embodiment of the present invention, the optical length Dr of the red pixel R is longer than the optical length Dg of the green pixel G by the thickness of the assistance member 192R, and the optical length Dg of the green pixel G is longer than the optical length Db of the blue pixel B by the difference between the thicknesses of the first organic light emitting member 370a and the second organic light emitting member 370b.

By forming the different microcavity structure for each pixel, the color reproducibility may be increased, and according to an exemplary embodiment of the present invention, the thickness of the assistance member 192R of the red pixel R, and the difference between the thicknesses of the first organic light emitting member 370a and the second organic light emitting member 370b are controlled in order to control the thickness of the microcavity structure in the red pixel R, the green pixel G, and the blue pixel B.

Figure 6:
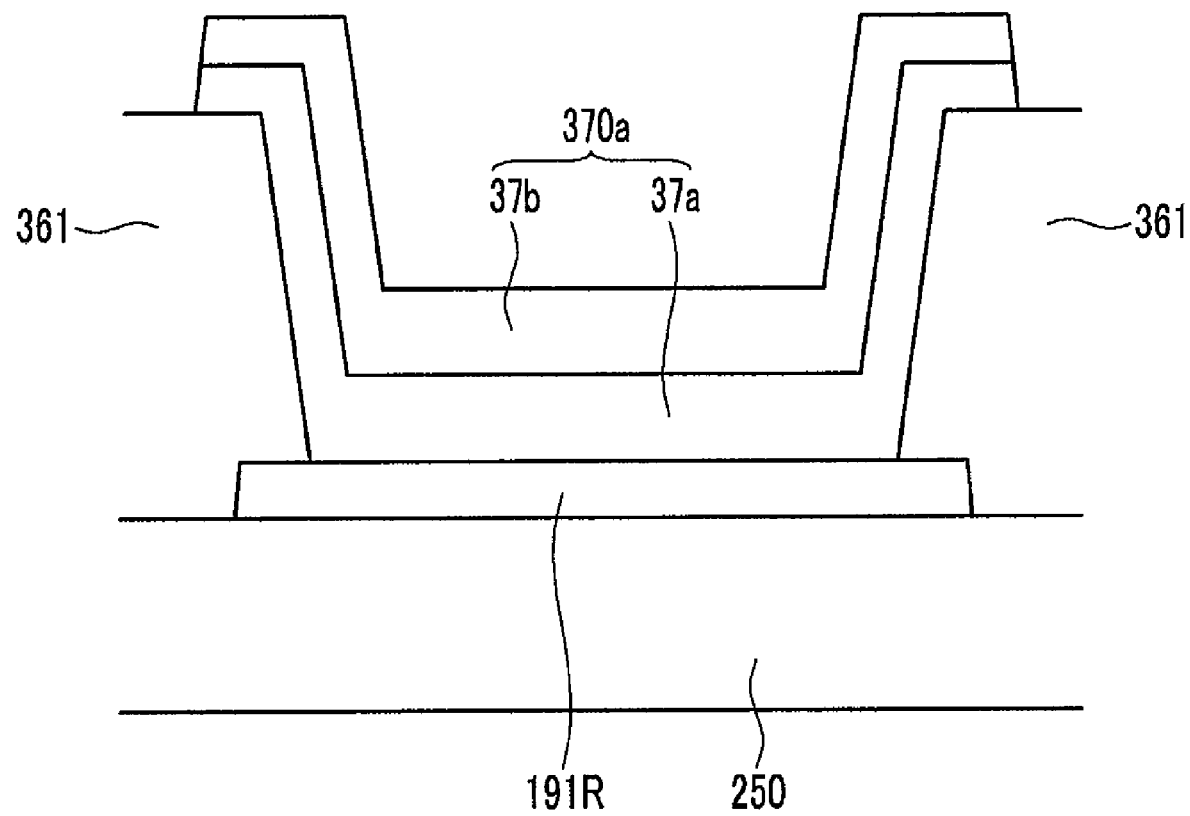
FIG. 6 is a cross-sectional view schematically showing the first light emitting member according to an exemplary embodiment of the present invention.
Figure 7:
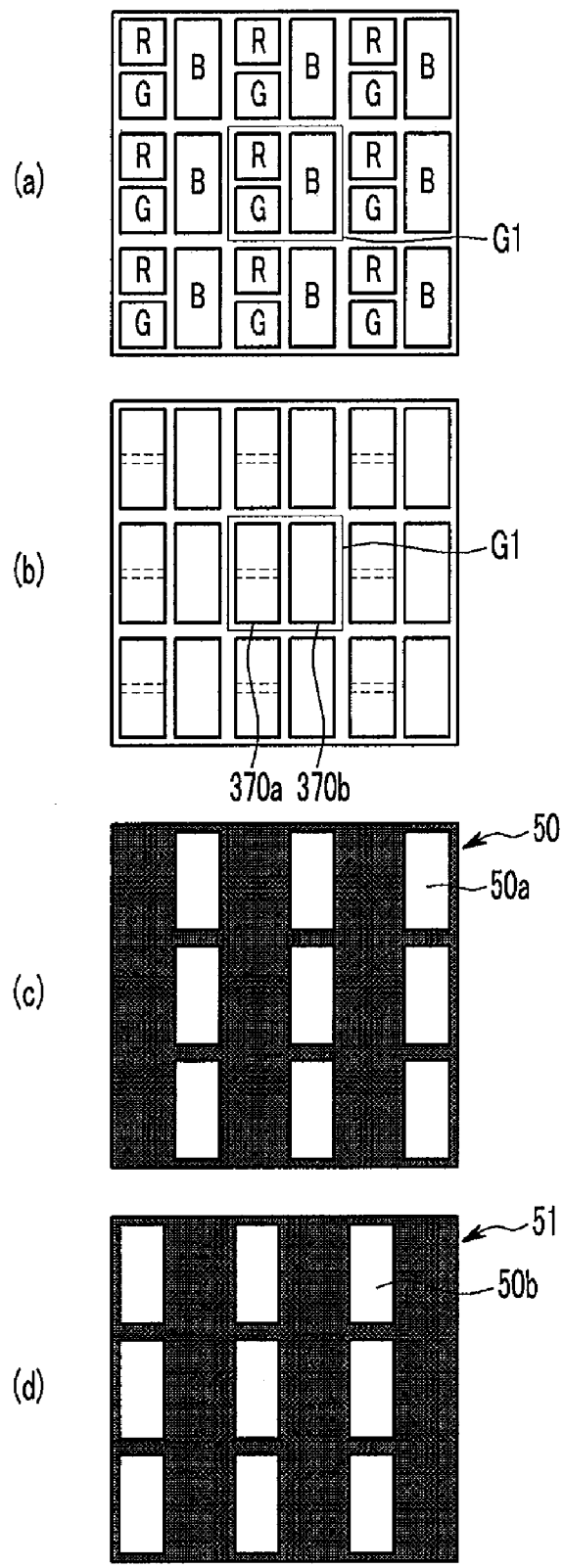
FIG. 7 to FIG. 11 are top plan views of an example of an arrangement of pixels in an organic light emitting device according to an exemplary embodiment of the present invention, and a metal mask used in a manufacturing method of the organic light emitting device.
Figure 8:
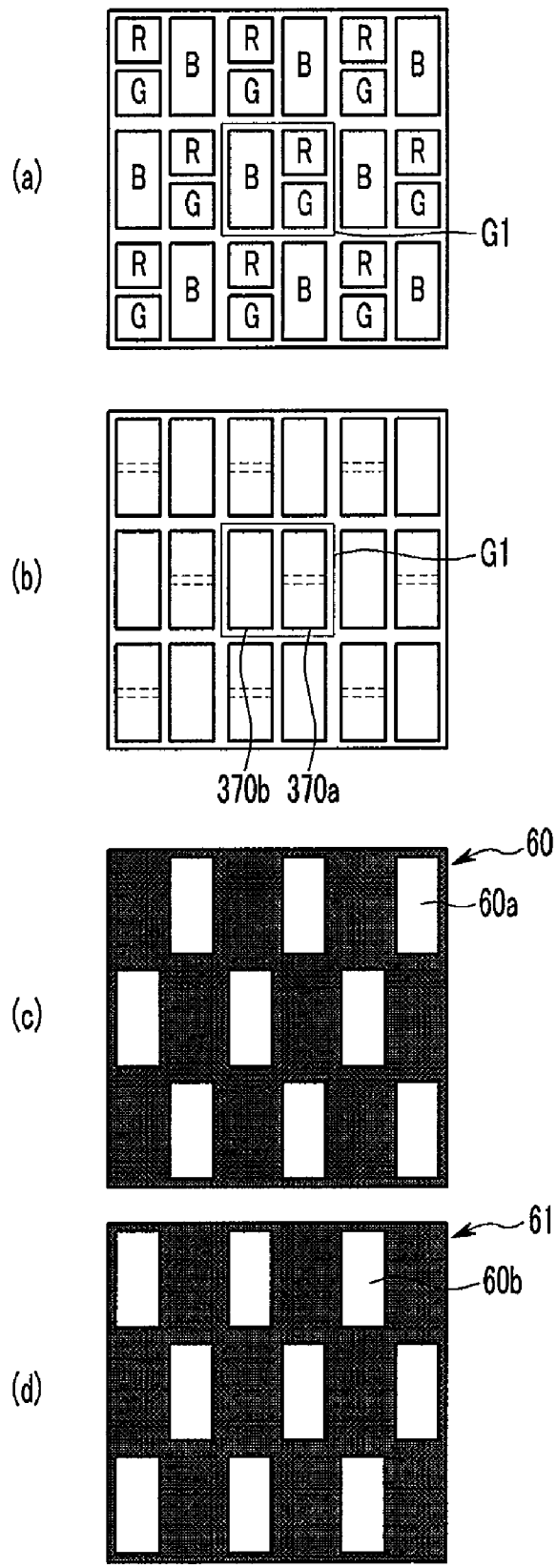
Figure 9:
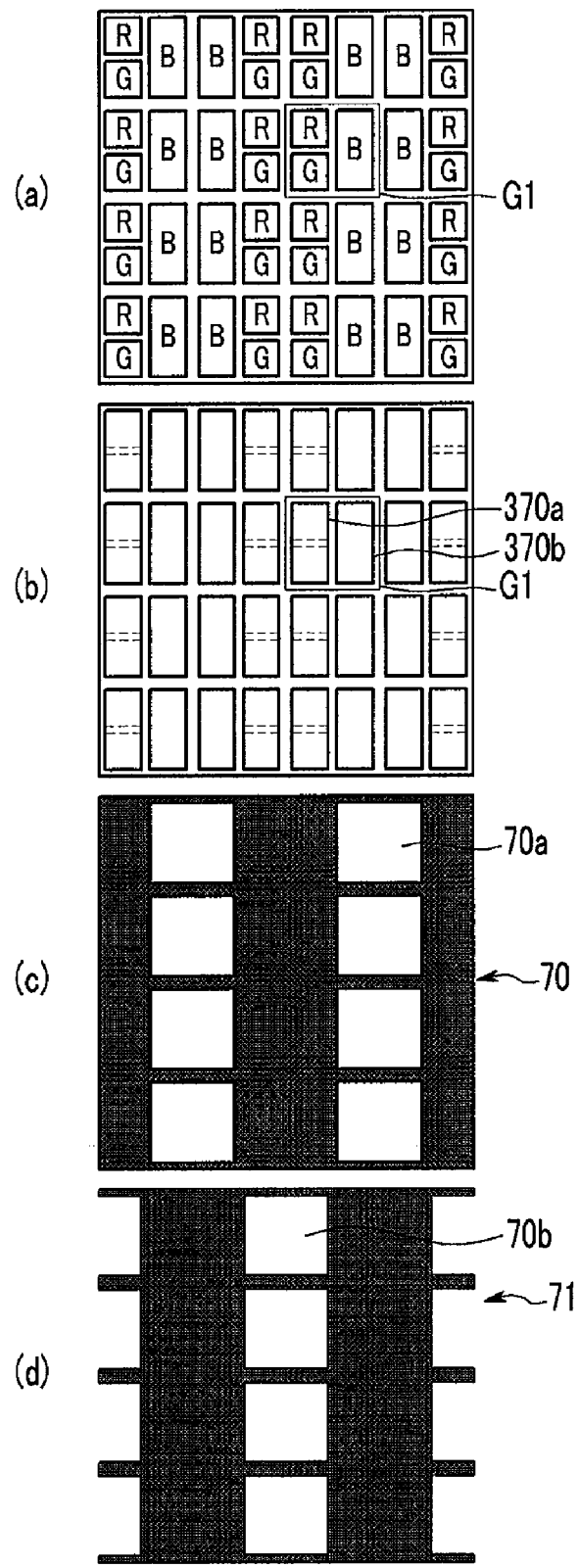
Figure 10:
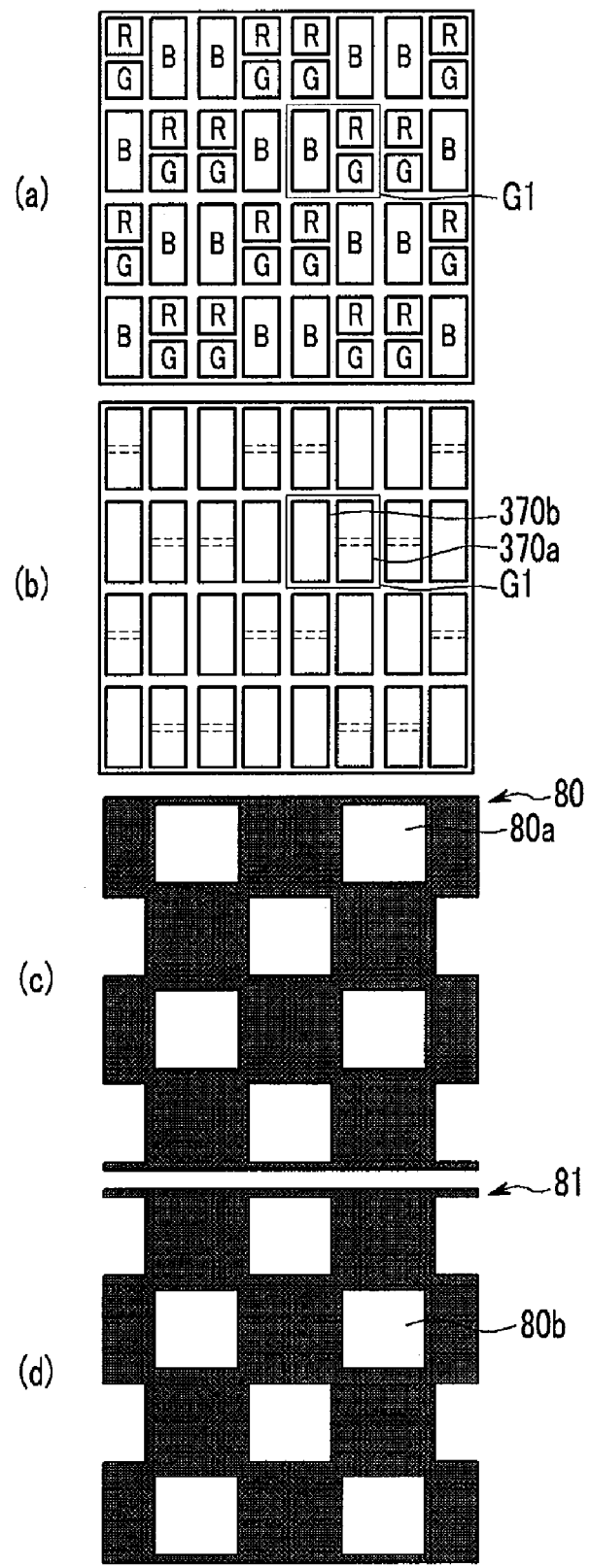

Next, the first light emitting member 370a according to an exemplary embodiment of the present invention will be described with reference to FIG. 6. FIG. 6 is a cross-sectional view schematically showing the first light emitting member according to an exemplary embodiment of the present invention.

Referring to FIG. 6, the first light emitting member 370a includes a first sub-light emitting member 37a and a second sub-light emitting member 37b, and has a structure in which the first sub-light emitting member 37a and the second sub-light emitting member 37b are sequentially deposited. One of the first sub-light emitting member 37a and the second sub-light emitting member 37b has a maximum light emitting wavelength value of about 500 nm to 550 nm thereby emitting the green color, and the other of the first sub-light emitting member 37a and the second sub-light emitting member 37b has a maximum light emitting wavelength value of about 580 nm to 640 nm thereby emitting the red color.

Next, a manufacturing method of an organic light emitting device according to an exemplary embodiment of the present invention will be described with reference to FIG. 7 to FIG. 11 as well as FIG. 5.

FIG. 7 to FIG. 11 are top plan views of an example of an arrangement of pixels in an organic light emitting device according to an exemplary embodiment of the present invention, and a metal mask used in a manufacturing method of the organic light emitting device.

Referring to FIG. 5, a plurality of driving transistors Qd, a thin film structure 112, and a plurality of color filters 230R, 230G, and 230B are formed on a substrate 110, and an overcoat 250 made of a photosensitive organic material and that is exposed and developed to form a plurality of through holes (not shown) therein and in the thin film structure 112 is formed thereon.

Next, a metal thin film (not shown) of Ag, Al, Au, Ni, Mg, or alloys thereof is deposited with a thin thickness of about 100 Å to 400 Å, and ITO is deposited thereon and patterned by photolithography to form pixel electrodes 191R, 191G, and 191B, an assistance member 192R, and transflective members 193R, 193G, and 193B. In a manufacturing method of an organic light emitting device according to an exemplary embodiment of the present invention, the formation of the assistance member 192R and the transflective members 193R, 193G, and 193B may be omitted, and only ITO is deposited and patterned by photolithography to form the pixel electrodes 191R, 191G, and 191B.

Here, the assistance member 192R of the red pixel R may be made of the same layer as the pixel electrodes 191R, 191G, and 191B. In this case, the pixel electrodes 191R, 191G, and 191B, and the assistance member 192R may be simultaneously formed, and after patterning the ITO, the ITO with the sum thickness of the pixel electrode 191R and the assistance member 192R is formed in the red pixel R, and the pixel electrodes 191G and 191B are respectively formed in the green pixels G and the blue pixel B to have the thickness of the ITO of the pixel electrodes 191G and 191B. To deposit with the same layer and to form the structure having different heights according to positions, a method may be used in which a photosensitive film having different thicknesses according to positions is formed and a first etch is executed, and then the thickness of the photosensitive film is reduced and a secondary etch is executed.

After completing the pixel electrodes 191R, 191G, and 191B and the assistance member 192R, the underlying metal thin film is etched to form the transflective members 193R, 193G, and 193B.

When the assistance member 192R disposed in the red pixel R is formed with the different layer from the pixel electrodes 191R, 191G, and 191B, the metal thin film is first etched to form the transflective members 193R, 193G, and 193B, and after forming the assistance member 192R in the red pixel R, the ITO is deposited and patterned by photolithography to form the pixel electrodes 191R, 191G, and 191B.

Next, the first organic light emitting member 370a and the second organic light emitting member 370b may be formed through a vapor deposition method. The first organic light emitting member 370a and the second organic light emitting member 370b are deposited by using different masks in different chambers, and will be described with reference to FIG. 7 to FIG. 10 and FIG. 11.

In FIG. 7 to FIG. 10, (a) represents the arrangement of the pixels, (b) represents the arrangement of the first organic light emitting member 370a and the second organic light emitting member 370b disposed in each pixel, (c) represents a metal mask for forming the first organic light emitting member 370a shown in (b), and (d) represents a metal mask for forming the second organic light emitting member 370b shown in (b).

Referring to (a) of FIG. 7 to FIG. 10, the arrangement of the pixels is similar to the pixel group G1 shown in FIG. 1, and the arrangement of the pixel group G1 may be varied as shown in (a) of FIG. 7 to FIG. 10. Also, the plane area of the red pixel R and the green pixel G may be smaller than the plane area of the blue pixel B, and may be about ½ thereof.

Referring to (b) of FIG. 7 to FIG. 10, the first organic light emitting member 370a is disposed in the red pixel R and the green pixel G, and the second organic light emitting member 370b is disposed in the blue pixel B.

Accordingly, the organic light emitting member may be formed by using two metal masks including a metal mask 50, 60, 70, or 80 respectively including openings 50a, 60a, 70a, and 80a according to the shape and arrangement of first organic light emitting member 370a as shown in (c) of FIG. 7 to FIG. 10, and a metal mask 51, 61, 71, or 81 respectively including opening 50b, 60b, 70b, and 80b according to the shape and arrangement of the second organic light emitting member 370b. The openings of the metal mask may have various shapes according to the shape and arrangement of the first organic light emitting member 370a and the second organic light emitting member 370b.

In the general organic light emitting device, for the organic light emitting members respectively emitting red, green, and blue in the red pixel R, the green pixel G, and the blue pixel B, to deposit the organic light emitting member emitting red, green, and blue, three masks including a metal mask including an opening according to the shape and arrangement of the red pixel, a metal mask including an opening according to the shape and arrangement of the green pixel, and a metal mask including an opening according to the shape and arrangement of the blue pixel are used. Also, the plane area of the red pixel R and the green pixel G is smaller than the plane area of the blue pixel B by about ½, and accordingly the size of the openings are small such that it is difficult to align them to the correct positions.

However, according to the manufacturing method of the organic light emitting device according to an exemplary embodiment of the present invention, although the plane area of the red pixel R and the green pixel G may be smaller than the plane area of the blue pixel B, the same first organic light emitting member 370a is disposed in the red pixel R and the green pixel G such that the size of the opening of the metal mask for depositing the organic light emitting member is increased. Accordingly, it is easy for the metal mask to be aligned when depositing the organic light emitting member.

Figure 11:
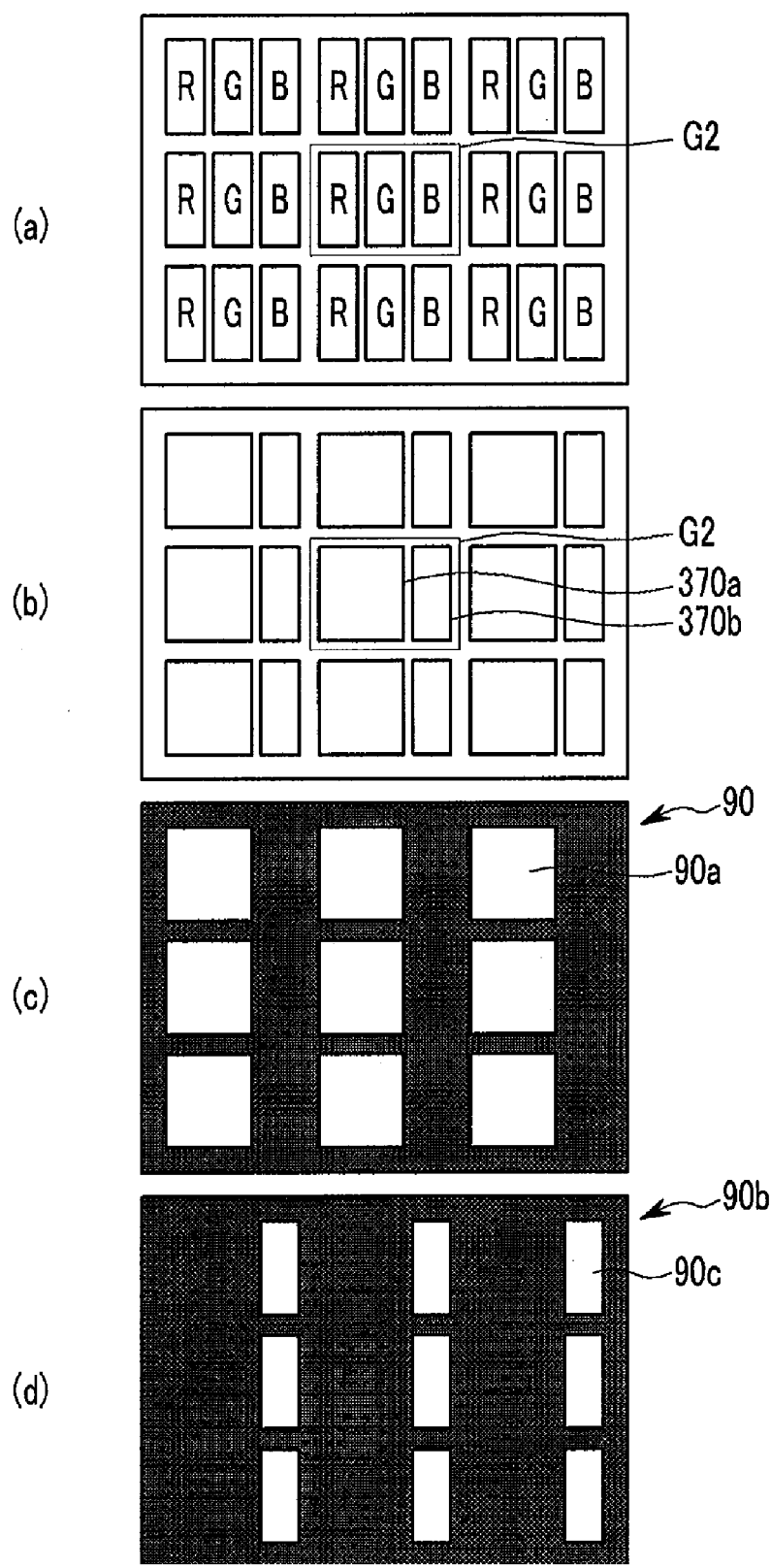

Next, the arrangement of the pixel group G2 and the metal mask will be described with reference to FIG. 11. FIG. 11(a) represents the arrangement of the pixel, (b) represents the arrangement of the first organic light emitting member 370a and the second organic light emitting member 370b disposed in each pixel, (c) represents a metal mask for forming the first organic light emitting member 370a shown in (b), and (d) represents a metal mask for forming the second organic light emitting member 370b.

Referring to FIG. 11(a), the arrangement of the pixels is similar to the pixel group G2 shown in FIG. 2, and the arrangement of the pixel group G2 may be varied, similar to (a) of FIG. 7 to FIG. 10. Also, the plane areas of the red pixel R, the green pixel G, and the blue pixel B may be similar.

Referring to FIG. 11(b), the first organic light emitting member 370a is disposed in the red pixel R and the green pixel G, and the second organic light emitting member 370b is disposed in the blue pixel B. Accordingly, the plane area of the first organic light emitting member 370a may be about two times the plane area of the second organic light emitting member 370b.

To deposit the organic light emitting member, two metal masks of a metal mask 90 including openings 90a according to the shape and arrangement of first organic light emitting member 370a as shown in FIG. 11(b), and a metal mask 90b having openings 90c according to the shape and arrangement of the second organic light emitting member 370b as shown in FIG. 11(b) may be used. The openings of the metal mask may have various shapes according to the shape and arrangement of the first organic light emitting member 370a and the second organic light emitting member 370b.

The plane area of the first organic light emitting member 370a may be about two times the plane area of the second organic light emitting member 370b such that the size of the opening of the metal mask may be large, and thereby it is easy to align the openings of the metal mask to the correct positions.

In this way, as shown in FIG. 7 to FIG. 11, the metal masks having the openings according to the shape and arrangement of the first organic light emitting member 370a and the second organic light emitting member 370b are used to sequentially form the first organic light emitting member 370a and the second organic light emitting member 370b.

As above-described, the maximum value among the light emitting wavelength of the first light emitting member 370a may be in a wavelength range of about 500 nm to 800 nm, and the maximum light emitting value of the first light emitting member 370a may have two wavelength ranges of about 500 nm to 550 nm and about 580 nm to 640 nm. The maximum value among the light emitting wavelength of the second light emitting member 370b may be in a wavelength range of about 400 nm to 500 nm, and may be about 460 nm.

When forming the first organic light emitting member 370a, the organic light emitting members of two kinds are mixed to have the maximum light emitting value in wavelength ranges of about 500 nm to 550 nm and about 580 nm to 640 nm, the organic light emitting members of two kinds may be simultaneously deposited in one layer, and the first sub-light emitting member having the maximum light emitting wavelength value of about 500 nm to 550 nm and the second sub-light emitting member having the light emitting maximum value wavelength of about 580 nm to 640 nm may be sequentially deposited.

Finally, as shown in FIG. 4, a common electrode 270 may be formed on substantially the whole surface of the substrate.

Next, an organic light emitting device according to another exemplary embodiment of the present invention will be described with reference to FIG. 12 to FIG. 14.

First, an arrangement of a plurality of pixels in an organic light emitting device according to another exemplary embodiment of the present invention will be described with reference to FIG. 12.

Figure 12:
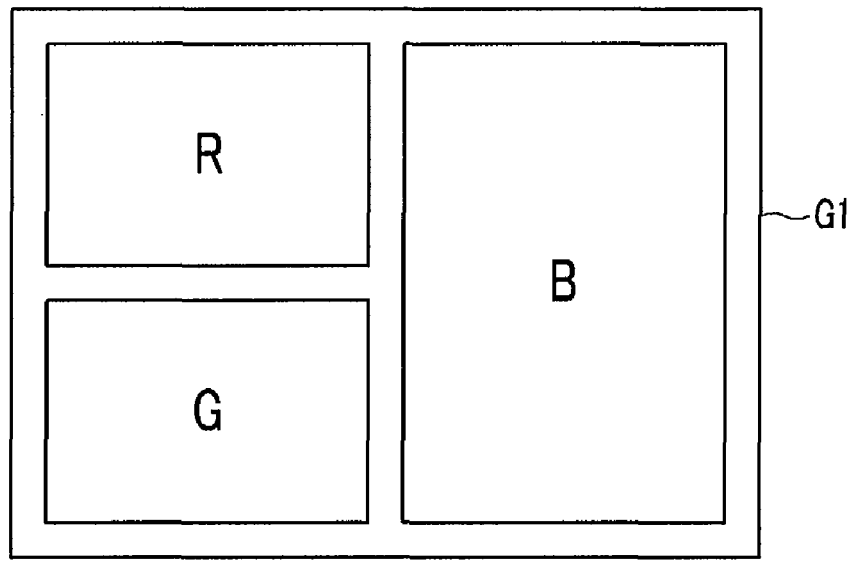
FIG. 12 is a top plan view schematically showing the arrangement of a plurality of pixels in an organic light emitting device according to another exemplary embodiment of the present invention.
Figure 12:
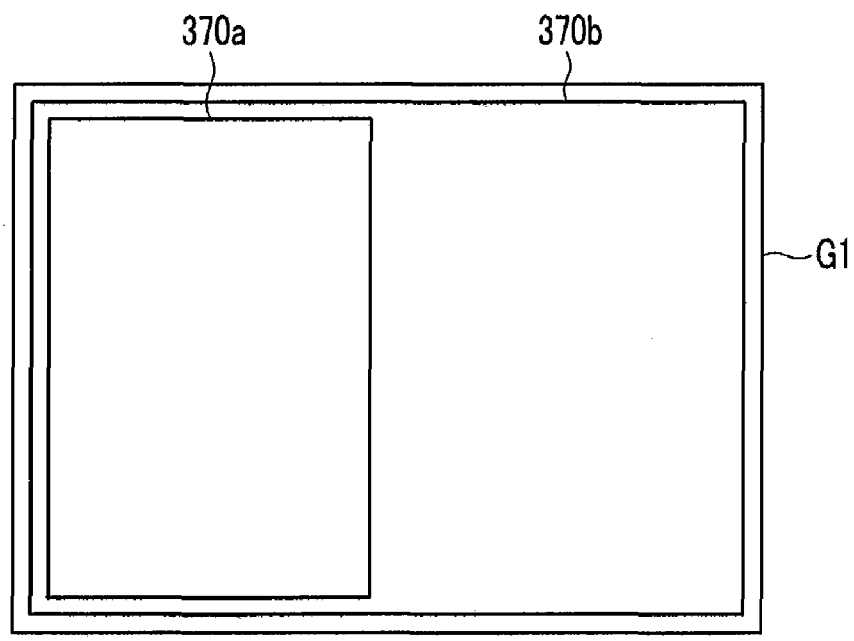
Figure 13:
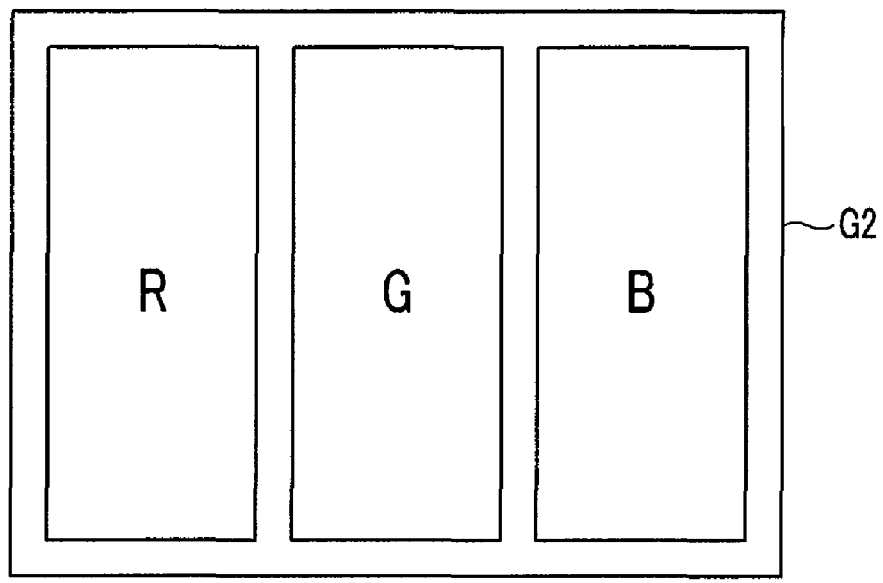
FIG. 13 is a top plan view schematically showing the arrangement of a plurality of pixels in an organic light emitting device according to another exemplary embodiment of the present invention.
Figure 13:
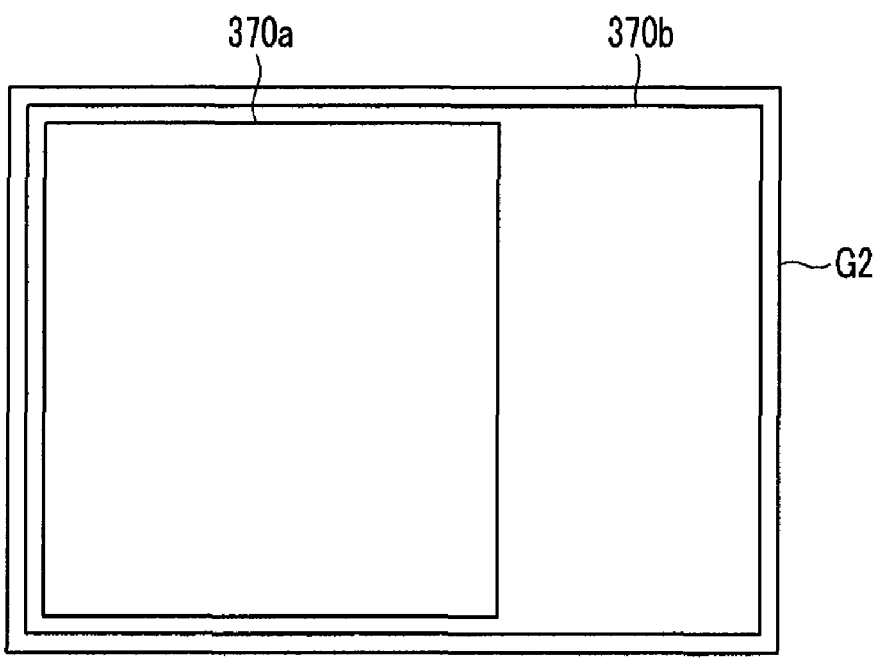

FIG. 12 is a top plan view schematically showing the arrangement of a plurality of pixels in an organic light emitting device according to another exemplary embodiment of the present invention. FIG. 12(a) represents an arrangement of the pixels, and FIG. 12(b) represents a light emitting member arranged in the pixels of FIG. 12(a).

Referring to FIG. 12(a), the arrangement of the pixels in the display device according to an exemplary embodiment of the present invention is similar to the arrangement of the pixels of FIG. 1. A red pixel R displaying red, a green pixel G displaying green, and a blue pixel B displaying blue are disposed while forming one group G1, and the area of the regions respectively occupied by the red pixel R and the green pixel G disposed in the pixel G1 may be almost the same with respect to each other, and the area of the region occupied by the blue pixel B may be larger than the area of the regions occupied by the red pixel R and the green pixel G, and may be twice the size of each.

Referring to FIG. 12(b), in the display device according to an exemplary embodiment of the present invention, the first light emitting member 370a is formed in the red pixel R and the green pixel G, and the second light emitting member 370b is formed in the red pixel R, the green pixel G, and the blue pixel B. That is, the second light emitting member 370b is formed substantially in the whole surface of the display device.

Like the organic light emitting device according to the above-described exemplary embodiment, the maximum value among the light emitting wavelength of the first light emitting member 370a may be a wavelength range of about 500 nm to 800 nm, and the maximum light emitting value of the first light emitting member 370a may have two wavelength ranges of about 500 nm to 550 nm and about 580 nm to 640 nm. The maximum value among the light emitting wavelength of the second light emitting member 370b may be in a wavelength range of about 400 nm to 500 nm, and may be about 460 nm. The first light emitting member 370a may have the layered structure of the first sub-light emitting member having the maximum light emitting wavelength value of about 500 nm to 550 nm, and the second sub-light emitting member having the maximum light emitting wavelength value of about 580 nm to 640 nm.

The first light emitting member 370a may emit the first color, for example an orange color, and the second light emitting member 370b may emit the second color, for example the blue color. The first light emitting member 370a has the layered structure of the first sub-light emitting member having the maximum light emitting wavelength value of about 500 nm to 550 nm thereby emitting green, and the second sub-light emitting member having the maximum light emitting wavelength value of about 580 nm to 640 nm thereby emitting red. Also, the first light emitting member 370a may be made of a single layer, and the single layer may include a white light emitting member and pigments emitting the orange color. The pigments emitting the orange color may be a mixture of the red pigments and the green pigments.

Second, an arrangement of a plurality of pixels in an organic light emitting device according to another exemplary embodiment of the present invention will be described with reference to FIG. 13. FIG. 13 is a top plan view schematically showing the arrangement of a plurality of pixels in an organic light emitting device according to another exemplary embodiment of the present invention, wherein FIG. 13(a) represents an arrangement of the pixels and FIG. 13(b) represents a light emitting member arranged in the pixels of FIG. 13(a).

Referring to FIG. 13(a), in a display device according to another exemplary embodiment of the present invention, a red pixel R displaying red, a green pixel G displaying green, and a blue pixel B displaying blue are disposed while forming one group G2, and the area of the regions occupied by the red pixel R, the green pixel G, and the blue pixel B may be almost the same.

Referring to FIG. 13(b), in the display device according to an exemplary embodiment of the present invention, the first light emitting member 370a is formed in the red pixel R and the green pixel G, and the second light emitting member 370b is formed in the red pixel R, the green pixel G, and the blue pixel B. That is, the second light emitting member 370b is formed substantially in the whole surface of the display device.

Like the organic light emitting device according to the above-described exemplary embodiment, the maximum value among the light emitting wavelength of the first light emitting member 370a may be in a wavelength range of about 500 nm to 800 nm, and the maximum light emitting value of the first light emitting member 370a may have two wavelength ranges of about 500 nm to 550 nm and about 580 nm to 640 nm. The maximum value among the light emitting wavelength of the second light emitting member 370b may be in the wavelength range of about 400 nm to 500 nm, and may be about 460 nm. The first light emitting member 370a may have the layered structure of the first sub-light emitting member having the maximum light emitting wavelength value of about 500 nm to 550 nm, and the second sub-light emitting member having the maximum light emitting wavelength value of about 580 nm to 640 nm.

Next, a detailed structure of one pixel group of the organic light emitting device according to another exemplary embodiment of the present invention will be described.

Figure 14:
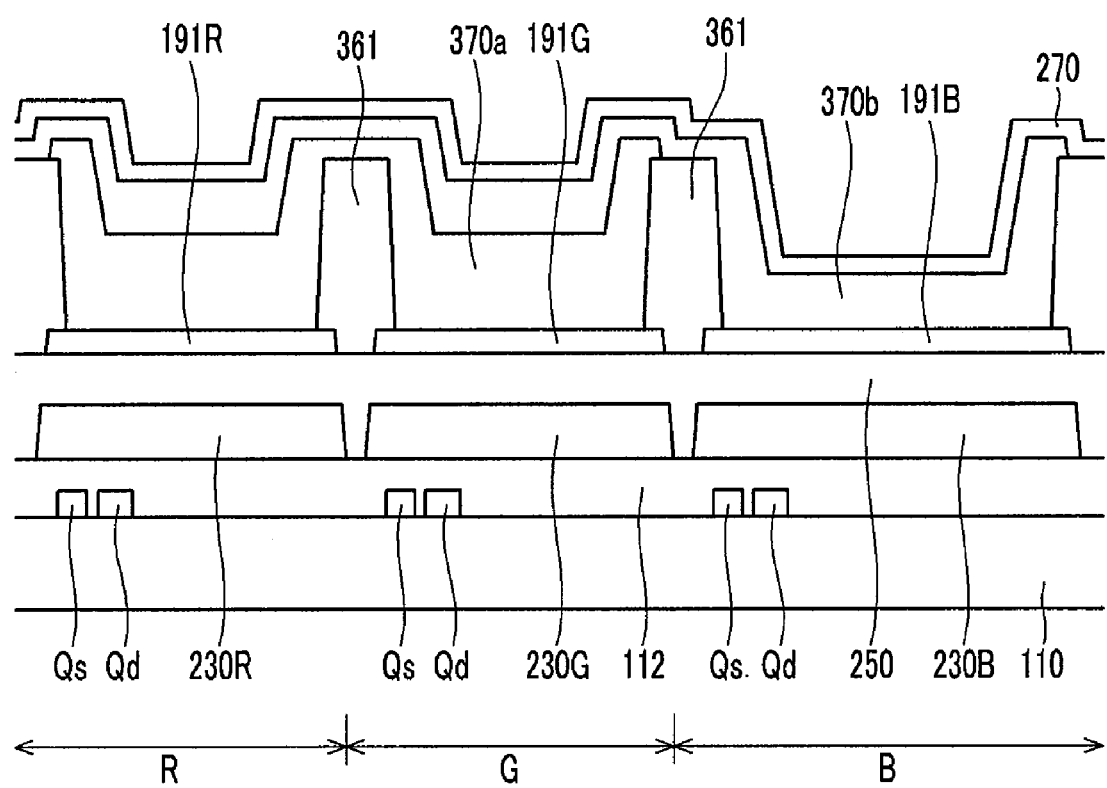
FIG. 14 is a cross-sectional view of an organic light emitting device according to another exemplary embodiment of the present invention.

FIG. 14 is a cross-sectional view of an organic light emitting device according to another exemplary embodiment of the present invention.

The layered structure of the organic light emitting device according to the present exemplary embodiment is similar to the organic light emitting device shown in the embodiment of FIG. 4.

A plurality of driving transistors Qd and a plurality of switching transistors Qs are formed on an insulation substrate 110, and a different thin film structure 112 is also formed. A red color filter 230R, a green color filter 230G, and a blue color filter 230B are formed on the thin film structure 112, and an overcoat 250 is formed on the color filters 230R, 230G, and 230B and the thin film structure 112. A plurality of pixel electrodes 191R, 191G, and 191B are formed on the overcoat 250. A plurality of insulating members 361 to define each pixel are formed on the pixel electrodes 191R, 191G, and 191B, the first organic light emitting member 370a and the second organic light emitting member 370b are formed on the insulating member 361 and the pixel electrodes 191R, 191G, and 191B, and a common electrode 270 is formed thereon.

However, in the organic light emitting device according of the present exemplary embodiment, the second light emitting member 370b is formed substantially on the whole surface of the display device, differently from the organic light emitting device shown in FIG. 4.

Accordingly, the first organic light emitting member 370a and the second organic light emitting member 370b are disposed in the red pixel R and the green pixel G, and the second organic light emitting member 370b is formed in the blue pixel B.

The second light emitting member 370b may be thinner than the first light emitting member 370a.

The maximum value among the light emitting wavelength of the first light emitting member 370a may be in the wavelength range of about 500 nm to 800 nm, and the maximum light emitting value of the first light emitting member 370a may have two wavelength ranges of about 500 nm to 550 nm and about 580 nm to 640 nm. The maximum value among the light emitting wavelength of the second light emitting member 370b may be in a wavelength range of about 400 nm to 500 nm, and may be about 460 nm. The first light emitting member 370a may have the layered structure of the first sub-light emitting member having the maximum light emitting wavelength value of about 500 nm to 550 nm, and the second sub-light emitting member having the maximum light emitting wavelength value of about 580 nm to 640 nm.

Also, in the case of the organic light emitting device according to the present exemplary embodiment, the second organic light emitting member 370b is formed on substantially the whole surface of the substrate such that the metal mask for depositing the second organic light emitting member 370b is not necessary. Accordingly, the organic light emitting member may be formed through only one metal mask having the opening according to the shape and arrangement according to the first organic light emitting member 370a. Also, the first organic light emitting member 370a is disposed on two pixels of the red pixel R and green pixel G such that the size of the opening of the metal mask may be about more than two times the size of the pixel, and thereby it is easy for the opening of the metal mask to be aligned to the correct position.

The various characteristics of the organic light emitting device shown in the embodiment of FIG. 4 may be applied to the organic light emitting device shown in the embodiment of FIG. 14.

Figure 15:
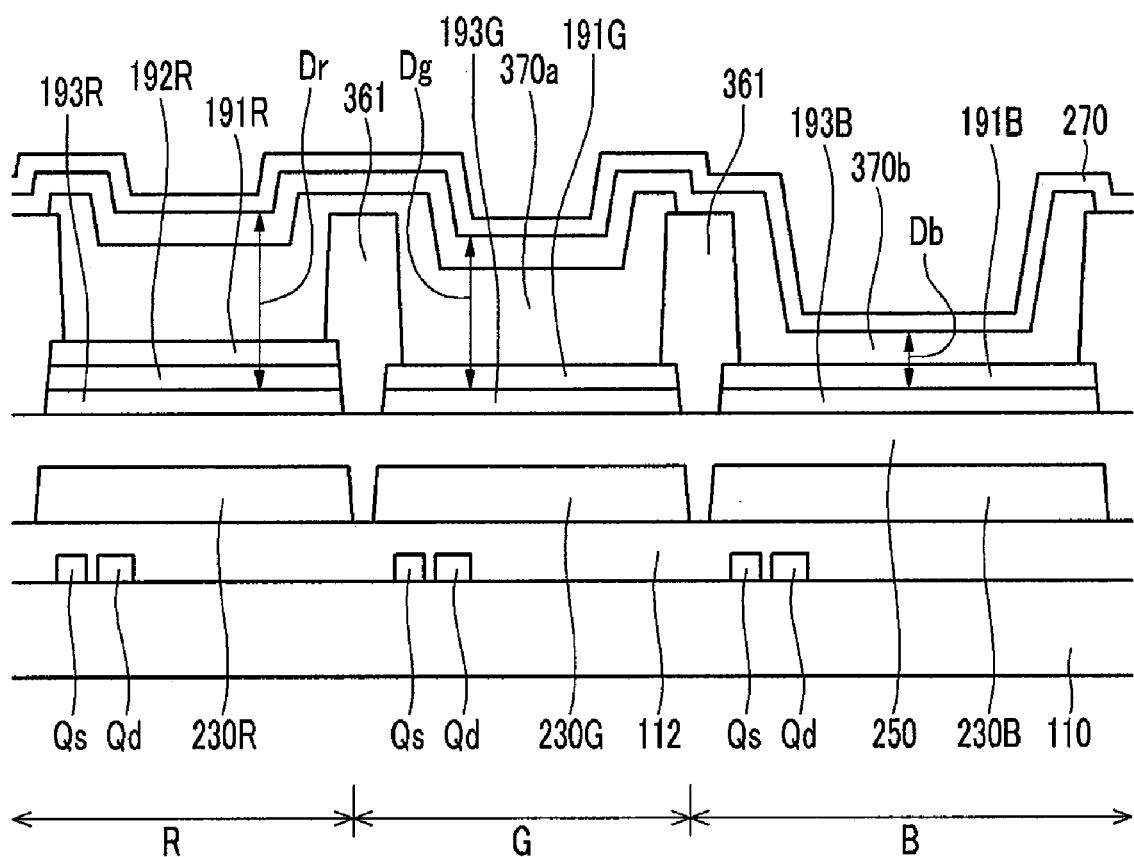
FIG. 15 is a cross-sectional view of an organic light emitting device according to another exemplary embodiment of the present invention.

Next, an organic light emitting device according to another exemplary embodiment of the present invention will be described with reference to FIG. 15. The layered structure of the organic light emitting device according to the present exemplary embodiment is similar to the organic light emitting device shown in the embodiment of FIG. 5.

A plurality of driving transistors Qd and a plurality of switching transistors Qs are formed on an insulation substrate 110, and a different thin film structure 112 is also formed. A red color filter 230R, a green color filter 230G, and a blue color filter 230B are formed on the thin film structure 112, and an overcoat 250 is formed on the color filters 230R, 230G, and 230B and the thin film structure 112. Transflective members 193R, 193G, and 193B are formed on the overcoat 250, and an assistance member 192R is formed on the transflective member 193R of the red pixel R. A plurality of pixel electrodes 191R, 191G, and 191B are formed on the assistance member 192R of the red pixel R, and the transflective members 193G and 193B of the green pixel G and the blue pixel B. A plurality of insulating members 361 to define each pixel are formed on the pixel electrodes 191R, 191G, and 191B, the first organic light emitting member 370a and the second organic light emitting member 370b are formed on the insulating member 361 and the pixel electrodes 191R, 191G, and 191B, and a common electrode 270 is formed thereon.

However, in the organic light emitting device according to the present exemplary embodiment, the second light emitting member 370b may be formed substantially on the whole surface of the display device, differently from the organic light emitting device shown in FIG. 5.

Accordingly, the first organic light emitting member 370a and the second organic light emitting member 370b are disposed in the red pixel R and the green pixel G, and the second organic light emitting member 370b is formed in the blue pixel B.

The second light emitting member 370b may be thinner than the first light emitting member 370a.

The maximum value among the light emitting wavelength of the first light emitting member 370a may be in the range of the wavelength range of about 500 nm to 800 nm, and the maximum light emitting value of the first light emitting member 370a may have two wavelength ranges of about 500 nm to 550 nm and about 580 nm to 640 nm. The maximum value among the light emitting wavelength of the second light emitting member 370b may be in the wavelength range of about 400 nm to 500 nm, and may be about 460 nm. The first light emitting member 370a may have the layered structure of the first sub-light emitting member having the maximum light emitting wavelength value of about 500 nm to 550 nm, and the second sub-light emitting member having the maximum light emitting wavelength value of about 580 nm to 640 nm.

The optical length Dr of the red pixel R is longest, the optical length Db of the blue pixel B is shortest, and the optical length Dg of the green pixel G is shorter than the optical length Dr of the red pixel R and is longer than the optical length Db of the blue pixel B.

According to an exemplary embodiment of the present invention, the optical length Dr of the red pixel R is longer than the optical length Dg of the green pixel G by the thickness of the assistance member 192R, and the optical length Dg of the green pixel G is longer than the optical length Db of the blue pixel B by the thicknesses of the first organic light emitting member 370a.

By forming the different microcavity structures for each pixel, the color reproducibility may be increased, and according to an exemplary embodiment of the present invention, the thickness of the assistance member 192R of the red pixel R and the difference between the thicknesses of the first organic light emitting member 370a and the second organic light emitting member 370b are controlled in order to control the thickness of the microcavity structure in the red pixel R, the green pixel G, and the blue pixel B.

Also, according to the organic light emitting device according to the present exemplary embodiment, since the second organic light emitting member 370b is formed on substantially the whole surface of the substrate, the metal mask for depositing the second organic light emitting member 370b is not necessary. Accordingly, the organic light emitting member may be formed through only one metal mask having the openings according to the shape and arrangement according to the first organic light emitting member 370a. Also, the first organic light emitting member 370a is disposed on two pixels of the red pixel R and green pixel G such that the size of the openings of the metal mask may be about more than two times the size of the pixel, and thereby it is easy for the openings of the metal mask to be aligned to the correct position.

Figure 16:
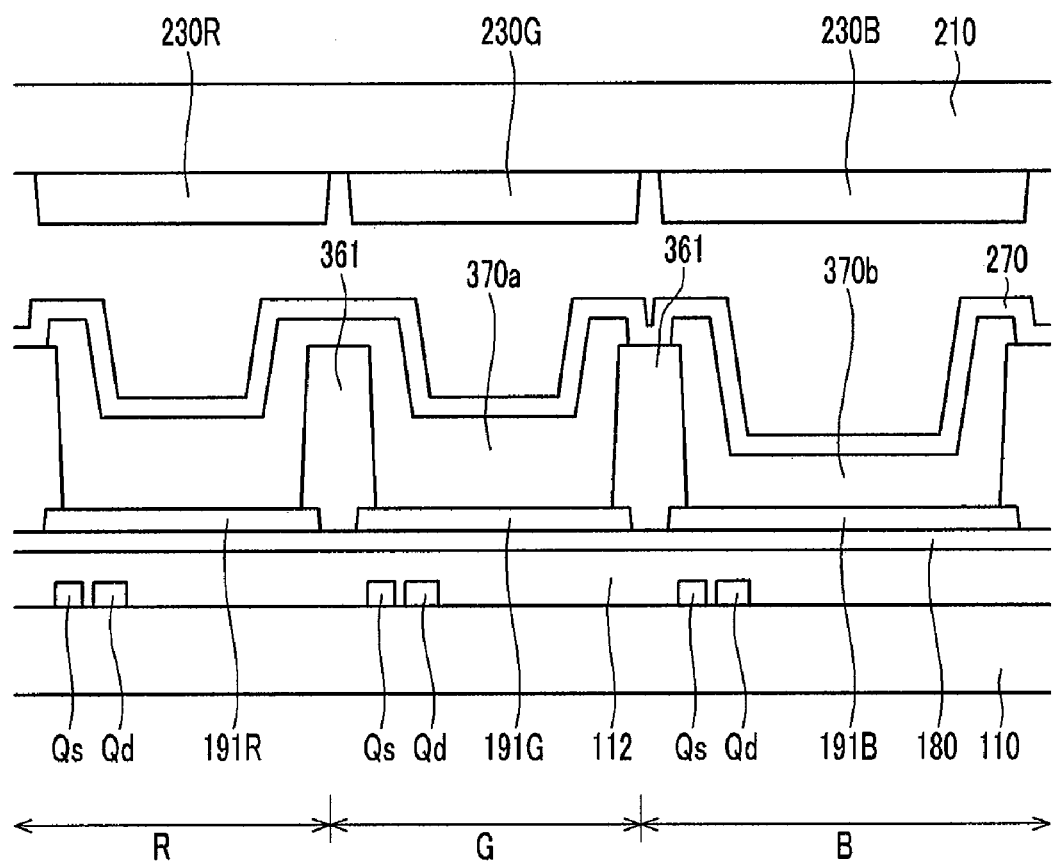
FIG. 16 is a cross-sectional view of an organic light emitting device according to another exemplary embodiment of the present invention.

Next, an organic light emitting device according to another exemplary embodiment of the present invention will be described with reference to FIG. 16. FIG. 16 is a cross-sectional view of an organic light emitting device according to another exemplary embodiment of the present invention.

As shown in FIG. 16, the layered structure of the organic light emitting device according to the present exemplary embodiment is similar to the organic light emitting device shown in the embodiment of FIG. 4.

A plurality of driving transistors Qd and a plurality of switching transistors Qs are formed on an insulation substrate 110, and a different thin film structure 112 is also formed. A passivation layer 180 is formed on the thin film structure 112, and a plurality of pixel electrodes 191R, 191G, and 191B are formed on the passivation layer 180. A plurality of insulating members 361 to define each pixel are formed on the pixel electrodes 191R, 191G, and 191B, the first organic light emitting member 370a and the second organic light emitting member 370b are formed on the insulating member 361, and the pixel electrodes 191R, 191G, and 191B, and a common electrode 270 are formed thereon.

The first light emitting member 370a may emit the first color, for example an orange color, and the second light emitting member 370b may emit the second color, for example the blue color. The first light emitting member 370a has the layered structure of the first sub-light emitting member having the maximum light emitting wavelength value of about 500 nm to 550 nm thereby emitting green, and the second sub-light emitting member having the maximum light emitting wavelength value of about 580 nm to 640 nm thereby emitting red. Also, the first light emitting member 370a may be made of a single layer, and the single layer may include a white light emitting member and pigments emitting the orange color. The pigments emitting the orange color may be a mixture of the red pigments and the green pigments.

However, differently from the organic light emitting device of the embodiment of FIG. 4, in the organic light emitting device according to the present exemplary embodiment, the red color filter 230R, the green color filter 230G, and the blue color filter 230B are formed on a counter substrate 210, and are disposed on the common electrode 270. Also, the pixel electrodes 191R, 191G, and 191B may be made of a reflective metal, and the common electrode 270 may be made of a transparent conductor. Accordingly, the light emitted from the first organic light emitting member 370a and the second organic light emitting member 370b toward the substrate 110 is reflective by the pixel electrodes 191R, 191G, and 191B, and is output in the direction on the counter substrate 210. Accordingly, the organic light emitting device according to the present exemplary embodiment displays images by emitting light upward of the substrate 210.

Embodiments of the present invention may be applied to different organic light emitting devices.

Also, embodiments of the present invention may be applied to a lighting device using the organic light emitting member as well as the organic light emitting device.

The lighting device according to an exemplary embodiment of the present invention may include the first organic light emitting member 370a having the maximum light emitting value in the wavelength range of about 500 nm to 800 nm and the second organic light emitting member 370b having the maximum light emitting value in the wavelength range of about 400 nm to 500 nm, and emits white light by a spatial sum of the light emitting regions of the first organic light emitting member 370a and the second organic light emitting member 370b.

Also, the maximum value among the light emitting wavelength of the first light emitting member 370a may be in the two wavelength ranges of about 500 nm to 550 nm and about 580 nm to 640 nm, and the maximum value among the light emitting wavelength of the second organic light emitting member 370b may be about 460 nm. The first light emitting member 370a has the layered structure of the first sub-light emitting member having the maximum light emitting wavelength value of about 500 nm to 550 nm thereby emitting green, and the second sub-light emitting member having the maximum light emitting wavelength value of about 580 nm to 640 nm thereby emitting red.

The lighting device according to an exemplary embodiment of the present invention may have the shape in which the first organic light emitting member 370a and the second organic light emitting member 370b formed on the different substrates are assembled. In this case, when the lifetime of the second organic light emitting member 370b having the maximum light emitting value at a wavelength of about 460 nm has a short lifetime that is eventually finished, the first organic light emitting member 370a remains, and only the substrate formed with the second organic light emitting member 370b is replaced to repair the error of the lighting device to thereby increase the overall lifetime of the lighting device.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. An organic light emitting device comprising:
    a substrate including a first region, a second region, and a third region;
    a thin film structure disposed on the substrate;
    a first color filter, a second color filter, and a third color filter formed on the thin film structure, and respectively corresponding to the first region, the second region, and the third region;
    a first light emitting member formed on the first region and the second region; and
    a second light emitting member disposed on the third region,
    wherein the first light emitting member has a maximum light emitting value in a wavelength range of about 500 nm to 800 nm, and
    the second light emitting member has a maximum light emitting value in a wavelength range of about 400 nm to 500 nm.

2. The organic light emitting device of claim 1, wherein the first light emitting member has a maximum light emitting value in two wavelength ranges of about 500 nm to 550 nm and about 580 nm to 640 nm.

3. The organic light emitting device of claim 2, wherein the first light emitting member includes a first sub-light-emitting member having a maximum light emitting value in a wavelength range of about 500 nm to 550 nm, and a second sub light-emitting member having the maximum light emitting value in a wavelength range of about 580 nm to 640 nm.

4. The organic light emitting device of claim 3, wherein the first sub-light-emitting member and the second sub-light-emitting member are sequentially deposited.

5. The organic light emitting device of claim 1, wherein the first light emitting member emits an orange color.

6. The organic light emitting device of claim 5, wherein the first light emitting member includes a first sub-light emitting member emitting red and a second sub light-emitting member emitting green.

7. The organic light emitting device of claim 1, wherein the plane area occupied by the first light emitting member is almost the same as the plane area occupied by the second light emitting member.

8. The organic light emitting device of claim 1, wherein the plane area occupied by the first light emitting member is different from the plane area occupied by the second light emitting member.

9. The organic light emitting device of claim 8, wherein the plane area occupied by the first light emitting member is about two times the plane area occupied by the second light emitting member.

10. The organic light emitting device of claim 1, wherein the second light emitting member has a maximum light emitting value at a wavelength of about 460 nm.

11. The organic light emitting device of claim 1, wherein the second light emitting member emits blue.

12. The organic light emitting device of claim 1, further comprising:
    an insulating layer formed on the first color filter, the second color filter, and the third color filter, and the thin film structure;
    a first transflective member, a second transflective member, and a third transflective member disposed on the insulating layer, and respectively formed in the first region, the second region, and the third region;
    an assistance member disposed on the first transflective member;
    a first pixel electrode, a second pixel electrode, and a third pixel electrode respectively formed on the assistance member, the second transflective member, and the third transflective member; and
    a common electrode formed on the first organic light emitting member and the second organic light emitting member.

13. The light emitting device of claim 12, wherein the first organic light emitting member is thicker than the second organic light emitting member.

14. The light emitting device of claim 12, wherein the assistance member, and the first pixel electrode, the second pixel electrode, and the third pixel electrode are formed with the same layer.

15. The organic light emitting device of claim 1, wherein the first color filter, the second color filter, and the third color filter are respectively a red filter, a green filter, and a blue filter.

16. The organic light emitting device of claim 1, wherein the second light emitting member is disposed on the first region and the second region.

* * * * *